United States Patent [19]

Guillet et al.

[11] Patent Number: 4,569,901
[45] Date of Patent: Feb. 11, 1986

[54] POLY(N-BENZYL ACRYLAMIDE) POLYMER CONTAINING NEGATIVE PHOTORESIST COMPOSITIONS

[75] Inventors: James E. Guillet, Don Mills; Michael Heskins, Toronto, both of Canada

[73] Assignee: Allied Corporation, Morris Township, Morris County, N.J.

[21] Appl. No.: 666,591

[22] Filed: Oct. 31, 1984

[51] Int. Cl.$^4$ .................. G03C 1/71; G03C 5/16; G03C 1/76
[52] U.S. Cl. .................. 430/270; 430/271; 430/311; 430/319; 526/305
[58] Field of Search ............. 430/270, 272, 271, 311, 430/319; 526/305

[56] References Cited

U.S. PATENT DOCUMENTS 2,732,358  1/1956  Jones .......................... 526/305 X
4,121,936 10/1978  Matsuda et al. ............... 430/271 X

FOREIGN PATENT DOCUMENTS 728353  4/1955  United Kingdom ............. 526/305

OTHER PUBLICATIONS

Chester L. Parris and Roger M. Christenson, "N-Alkylation of Nitriles with Benzyl Alcohol Related Alcohols and Glycols", *Journal of Organic Chemistry* vol. 25, pp. 331-334, Mar. 1960.

Primary Examiner—John E. Kittle
Assistant Examiner—Cynthia Hamilton
Attorney, Agent, or Firm—Arthur J. Plantamura; Jay P. Friedenson; Patrick L. Henry

[57] ABSTRACT

Negative photoresist materials are provided that are sensitive in the deep ultraviolet (UV) light range of about 200 nm-300 nm. These materials permit higher resolution then those sensitive to longer wavelengths and thus a higher information density in the microcircuits manufactured using them. This sensitivity in the deep UV is obtained without loss of the other normal attributes of a resist material: good adhesion to substrates, good contrast in images formed, and good etch resistance properties.

The polymeric negative photoresist molecules are the homopolymers of N-benzyl acrylamide and its analogues of the general structure

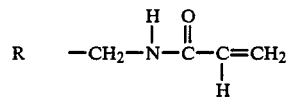

where R=alkyl, aryl, halogen, or nitrogen, and copolymers thereof with at least one vinylidene monomer of the general formula

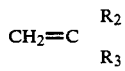

wherein $R_2$ and $R_3$ are substituents selected from the group consisting of halogen or an alkyl group, aryl, substituted aryl, carboxylic acid, lower alkyl carboxylate, lower alkyl, lower alkenyl, hydrogen, halogen, nitrile, lower acyloxy, lower alkoxy or amido, the relative proportions being chosen so as to produce a solid copolymer containing at least 0.1 weight percent of said N-benzyl acrylamide monomer.

7 Claims, No Drawings

POLY(N-BENZYL ACRYLAMIDE) POLYMER CONTAINING NEGATIVE PHOTORESIST COMPOSITIONS

BACKGROUND OF THE INVENTION

1. Field of the Invention

This invention relates to a novel negative photoresist composition and to the method for providing photoresist layers. In particular the invention deals with N-benzyl acrylamide homopolymers and copolymers, and ultraviolet light sensitive negative photoresists that have good wetting properties on various substrates. The invention is particularly useful in that the photoresist compositions provided are sensitive to relatively shorter wavelengths of light, i.e., those that are sensitive in the deep ultraviolet light range of from about 200 nm to about 300 nm.

2. Description of the Prior Art

Photoresists are materials which change their solubility in response to a developer solution after the photoresist has been exposed, such as to ultraviolet radiation. Photoresist compositions may comprise a photosensitive compound, a film forming polymer and a solvent or in lieu of the photosensitizer and polymer, a polymer which is itself photosensitive may be used. As a consequence of the exposure to radiation of the photoresist, a different solubility rate results between the exposed and unexposed (masked over) portions of a resist film that yields a surface relief pattern after the development. Those photoresists which become more soluble in the exposed regions are referred to as "positive working" photoresists while those whose solubility is diminished by exposure to light are designated as "negative working" photoresists.

One of the limitations of materials currently used as commercial photoresists is their lack of sensitivity to light at wavelengths much below 300 nm. The resolution attainable with these resists is typically in the 2–4μ range and would be improved were they sensitive to shorter wavelengths of light. There is, therefore, a need for photoresist materials that are sensitive in the deep UV (200–300 nm) light range which permit higher resolution and thus a higher information density in the microcircuits manufactured using them. This sensitivity in the deep UV must be accompanied by the other normal attributes of a resist material including good adhesion to substrates, good contrast in images formed, and good etch resistance properties.

SUMMARY OF THE INVENTION

In accordance with the invention, we have discovered a new class of polymeric negative photoresists consisting of (a) homopolymers, and (b) copolymers, of N-benzyl acrylamide and its analogues.

The homopolymers (a) are the polymerized product of the monomers of the general formula:

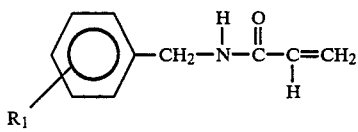

wherein $R_1$ is a substituent selected from the group consisting of hydrogen, alkyl, aryl, halogen, amino or nitro. Copolymers include the combination of one or more of the above N-benzyl acrylamide monomer with the comonomers selected from the group consisting of vinyl acetate, methyl acrylate, methyl methacrylate, acrylamide, methacrylamide and acrylonitrile. Those poly(N-benzyl acrylamide) polymers are sensitive to light in the 250–300 nm region thereby fulfilling the primary need described above.

The monomer is synthesized by treating an acrylonitrile, sulfuric acid mixture with benzyl alcohol, following the procedures known in the art as disclosed, for example, by the method of Parres and Christenson [J. Org. Chem., 25, 331 (1960)].

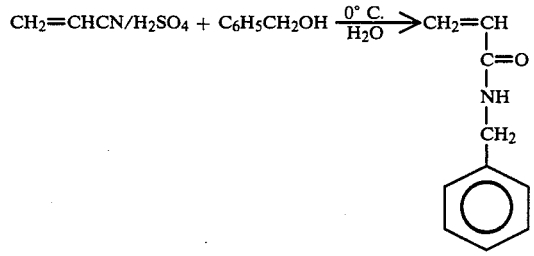

and as described hereinafter also by way of example.

The polymer is formed through a free radical polymerization using lauryl peroxide initiator in toluene solvent.

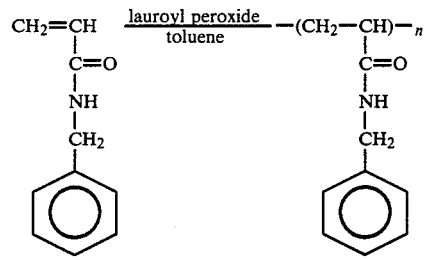

Intrinsic viscosity of the polymer product was typically about 0.2 dl/gm suggesting a molecular weight in the $10^4$–$10^5$ range. The UV spectum of the polymer shows a significant absorbence in the 250–300 nm region.

The exposure of a thin film of this polymer gave a developable image over most of the desirable exposure range and etch resistance tests show favorble rates in comparison to $SiO_2$ standards.

These materials are useful as negative deep UV resists from which films can be spun, exposed and developed using conventional practices. The lack of significant absorbance of light above 300 nm permits the attainment of higher resolution than with those resists working at the longer wavelengths. They may also be useful as e-beam resist compositions.

DESCRIPTION OF THE PREFERRED EMBODIMENT

The novel photosensitive compositions contemplated by the invention are the polymeric negative photoresists consisting of (a) homopolymers of N-benzyl acrylamide and its analogues of the formula:

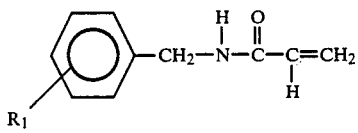

wherein R is selected from the group consisting of hydrogen, 1–6 carbon alkyl and halogen substituted alkyl radicals, aryl and halogen substituted aryl radicals, methoxy and ethoxy radicals, and halogen and nitro substituents, and (b) copolymers of (a) and one or more vinylidene comonomer. Such copolymers include the combination of one or more of the above N-benzyl acrylamide monomer (a) and at least one vinylidene monomer (b) of the general formula

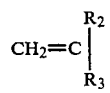

wherein $R_2$ and $R_3$ are substituents selected from the group consisting of halogen or an alkyl group, aryl, substituted aryl, carboxylic acid, lower alkyl carboxylate, lower alkyl, lower alkenyl, hydrogen, halogen, nitrile, lower acyloxy, lower alkoxy or amido, the relative proportions being chosen so as to produce a solid copolymer containing at least 0.1 weight percent of said N-benzyl acrylamide monomer.

Examples of suitable vinylidene monomers include styrene, methyl acrylate, ethyl acrylate, methyl methacrylate, vinyl acetate, methacrylonitrile, acrylonitrile, vinyl chloride, acrylic acid, methacrylic acid, chlorostyrene, α-methylstyrene, vinyl toluene, butadiene, isoprene and the like. Preferred practical polymer compositions within the contemplated invention include vinyl acetate, ethyl acrylate, methyl acrylate, acrylonitrile and acrylamide as comonomers (b) with the comonomers (a).

In preparing the benzyl acrylamide polymers (a) the polymer is obtained by polymerizing of the invention, from the corresponding N-benzyl acrylamide monomer. This is shown below with N-benzyl acrylamide

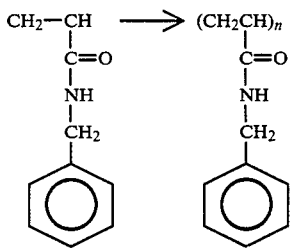

white powder
m.p. 69–70° C.

The monomer is synthesized by treating an acrylonitrile and sulfuric acid mixture with benzyl alcohol, following known procedures, e.g., see Parris and Christenson [J. Org. Chem., 25, 331 (1960)].

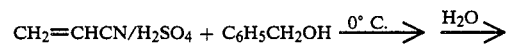

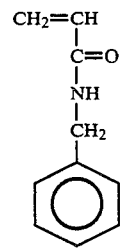

The polymer thereof is formed through a free radical polymerization using as uitable initiator, such as lauryl peroxide in a suitable solvent such as toluene.

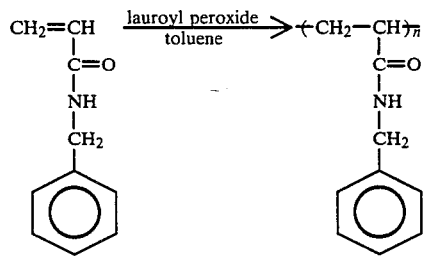

Intrinsic viscosity of the polymer product was typically about 0.2, indicating the value of n such that the molecular weight is in the $10^4$–$10^5$ range.

The UV absorbance spectrum illustrates the effectiveness of absorbance in the 250–300 nm region with very little absorbance above 300 nm.

A 0–4800 mJ step tablet exposure of a thin film of this polymer (Optical Associates, Inc. mercury-xenon lamp source, no filter) gave a developable image over most of the exposure range; 1μ lines were resolved at the 1600 mJ exposure level. Etch resistance tests show favorable rates in comparison to $SiO_2$ standards.

Films spun from photoresist compositions using these polymer upon exposure and developing using conventional procedures, show a lack of significant absorbence of light above 300 nm thereby permitting attainment of higher resolution than with those resists working at the longer wavelengths. Compositions prepared from the corresponding methacrylamide material, i.e., (poly(N-benzyl methacrylamide)) were also synthesized and tested and were found to provide comparatively weak crosslinking upon UV exposure of films and formed images that developed poorly.

The invention will be further described by reference to the following specific examples. It would be understood, however, that although these examples may describe in detail certain preferred operating compositions and/or conditions of the invention, they are given primarily for a purposes of illustration and the invention in its broader aspects is not limited thereto.

EXAMPLE I

SYNTHESIS OF N-BENZYL ACRYLAMIDE

Acrylonitrile (190.2 gm, 3.6 moles) was placed in a 1 liter flask equipped with a dropping funnel, mechanical stirrer and thermometer. Concentrated sulfuric acid (75 ml) was added dropwise over a period of 1 hour to the acrylonitrile which was cooled to 4°–6° C. by an ice bath. A clean dropping funnel was substituted and benzyl alcohol (104.5 gm, 0.97 moles) was added over a period of 75 minutes to the reaction mixture which was maintained at 8°–10° C. The solution was stirred at 10° C. for 2 hours and at ambient temperatures for 48 hours.

The reaction mixture was then poured into ice water (400 ml). The layers were separated and the aqueous fracion was washed with toluene (2×200 ml). The combined organic fractions were washed with saturated aq. NaCl (2×150 ml), saturated aq NaHCO$_3$ (150 ml) and finally with (150 ml) aq. NaCl. The organic fractions were dried (anhydrous Na$_2$SO$_4$) and solvent removed by distillation (0.5 gm 2,5-di-tert-butyl hydroquinone was added as stabilizer.) The residue was triturated with hexane and solidified upon standing in the cold. The solid was purified by vacuum distillation. Two fractions were collected. The first fraction (b.p. 167°–170° at 3.8 mm Hg) gave 17.7 gm of a yellow solid which was recrystallized from toluene to give 10.7 gm of colorless needles m.p. 68°–69° (Lit. 70) The second fraction (b.p. 170°–175° at 3.8 mm Hg) gave 46.0 gm of a solid. Recrystallization from toluene gave 28.3 gm of the compound (m.p. 69°–70°) A second crop (7.8 gm, m.p. 67.5–68.5 was obtained by concentrating the mother liquor; the total yield of N-benzylacrylamide was 46.8 gm (33%).

EXAMPLE II

METHOD FOR PREPARATION OF POLY(N-BENZYL ACRYLAMIDE)

Preparation of poly N-benzyl acrylamide. Ingredients:

4.9970 gm N benzyl acrylamide
0.0208 lauroyl peroxide
25 ml Toluene

All ingredients were placed in a round bottomed, 3 necked flask fitted with condenser and mechanical stirring bar. The mixture was stirred until all components were dissolved. The solution was deoxygenated by flushing with nitrogen for 30 minutes and then the flask was left under a nitrogen blanket. The flask and contents were then heated to 80° C. in an oil bath and allowed to polymerise for 3 hours.

The polymer precipitated from solution as polymerisation proceded. The solvent was decanted off and the residue dissolved in acetone. Precipitation of the polymer by first adding toluene unil the solution became cloudy and then pouring into hexane gave a semisolid precipitate. The polymer was allowed to stand two days under fresh hexane when the polymer had become solid and brittle. The polymer was broken up, filtered and dried in a dessicator.

0.3 gm of polymer were recovered (60% yield).

EXAMPLE III

Poly(N-arylacrylamides)

Homopolymers of the N-benzyl acrylamide (pB$_z$A) and N-benzyl methacrylamide (pB$_z$MA) monomers were prepared. Lauroyl peroxide was used as initiator in 20% solutions of the monomer in toluene. Yields were 60% in both cases. Preliminary O$_2$ etch tests were conducted on coated Si wafers using a barrel plasma. The relative etch rate was determined by measuring the film weight loss following etching of each of the film coated Si wafers. These relative etch rates are presented in Table I with the result for uncrosslinked polyvinylalcohol control samples being defined as 1.0.

TABLE I

| POLYMER | RELATIVE ETCH RATE |
|---|---|
| Uncrosslinked PVA | 1.00 |
| pB$_z$MA | 0.25 |
| pB$_z$A | 0.16 |

EXAMPLE IV

2. Poly(N-benzyl acrylamide) and poly(N-benzyl methacrylamide)

Polymerizations of N-benzyl acrylamide and N-benzyl methacrylamide were repeated on a large scale sufficient to provide enough material for CF$_4$/O$_2$ etch resistance testing. Results are presented in Table II where R is the etch rate relative to SiO$_2$ (averaged with respect to two SiO$_2$ control wafers). Films studied were 4500 Å thick, spun from 17% solutions in cellusolve acetate.

TABLE II

| Reaction no. | Polymer | Absolute etch rate, Å/min | R |
|---|---|---|---|
| 1 | PBzA #1 | 444 ± 18 | 0.567 ± 0.010 |
| 2 | PBzA #2 | 639 ± 55 | 0.853 ± 0.038 |
| 3 | PBzMA #1 | 604 ± 17 | 0.809 ± 0.023 |
| 4 | PBzMA #2 | 470 ± 31 | 0.621 ± 0.031 |

The data show good standard deviations for each run but poor agreement between duplicate runs which is likely due to problems of plasma reproducibility.

Spun films of both PBzA and PBzMA were exposed to UV light for 200 s through an Opto-Line step tablet using an Optical Associates Inc. (OAI) xenon mercury lamp. Lamp output was measured as 24 mW/cm$^2$ by an OAI 260 nm centered power detector. Development for 3 min in a 82:18 toluene:acetone solutions showed virtually no image in the PBzMA film but a good image in the PBzA sample.

The invention contemplates, in addition to the novel photoresist composition, an article of manufacture comprising a microcircuit element substrate having applied thereon the novel polymeric photoresist compositions of the invention.

It will be apparent that various modifications may be made by one skilled in the art within the scope of, and without departing from the spirit of, the present invention.

What is claimed is:

1. An article of manufacture comprising a microcircuit element substrate having applied thereon a thin film of a negative photoresist composition of
   a polymeric compound sensitive to light in the ultraviolet light range and
   comprising (a) a polymer selected from the group consisting of homopolymers of N-benzyl acrylamide monomers of the formula:

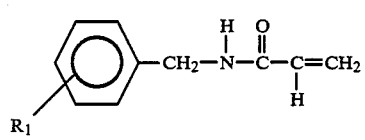

wherein
   R$_1$ is selected from the group consisting of hydrogen, 1–6 carbon alkyl and halogen substituted alkyl radicals, aryl and halogen substituted aryl radicals, methoxy and ethoxy radicals, halogen and nitro substituents, and mixtures thereof, and copolymers including the monomers of (a) with at least one vinylidene monomer of general formula

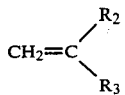

wherein $R_2$ and $R_3$ are substituents selected from the group consisting of aryl, substituted aryl, carboxylic acid, lower alkyl carboxylate, lower alkyl, lower alkenyl, hydrogen, halogen, nitrile, lower acyloxy, lower alkoxy and amido, the relative proportions being chosen so as to produce a solid copolymer containing at least 0.1 weight percent of said N-benzyl acrylamide monomer.

2. The photoresist composition of claim 1 wherein the photosensitive polymeric compound is poly(N-benzyl acrylamide).

3. The photoresist composition of claim 1 wherein the photosensitive polymeric compound is a copolymer of N-benzyl acrylamide and a vinyl acetate comonomer.

4. The photoresist composition of claim 1 wherein the vinylidene co-monomer is ethyl acrylate.

5. The photoresist composition of claim 1 wherein the vinylidene co-monomer is methyl acrylate.

6. The photoresist composition of claim 1 wherein the vinylidene co-monomer is acrylonitrile.

7. The photoresist composition of claim 1 wherein the vinylidene co-monomer is acrylamide.

* * * * *